(12) United States Patent
Hansen et al.

(10) Patent No.: US 9,139,932 B2
(45) Date of Patent: Sep. 22, 2015

(54) QUARTZ GLASS CRUCIBLE AND METHOD FOR TREATING SURFACE OF QUARTZ GLASS CRUCIBLE

(76) Inventors: Richard Lee Hansen, Mentor, OH (US); Theodore P. Kircher, Ashtabula, OH (US); Narsi Devanathan, Solon, OH (US)

( * ) Notice: Subject to any disclaimer, the term of this patent is extended or adjusted under 35 U.S.C. 154(b) by 2031 days.

(21) Appl. No.: 11/899,786

(22) Filed: Sep. 7, 2007

(65) Prior Publication Data

US 2008/0092804 A1   Apr. 24, 2008

Related U.S. Application Data

(63) Continuation-in-part of application No. 11/550,646, filed on Oct. 18, 2006, now abandoned, and a continuation-in-part of application No. 11/550,666, filed on Oct. 18, 2006, now abandoned, and a continuation-in-part of application No. 11/550,680, filed on Oct. 18, 2006, now abandoned.

(51) Int. Cl.
| | |
|---|---|
| *C30B 15/10* | (2006.01) |
| *C03C 17/30* | (2006.01) |
| *C30B 29/06* | (2006.01) |
| *C30B 35/00* | (2006.01) |

(52) U.S. Cl.
CPC ............... *C30B 15/10* (2013.01); *C03C 17/30* (2013.01); *C30B 29/06* (2013.01); *C30B 35/002* (2013.01); *C03C 2218/31* (2013.01); *Y10T 117/1024* (2015.01); *Y10T 428/31612* (2015.04)

(58) Field of Classification Search
USPC .................. 117/200, 206, 213; 65/374.11, 33
See application file for complete search history.

(56) References Cited

U.S. PATENT DOCUMENTS

| | | | |
|---|---|---|---|
| 4,416,680 | A | 11/1983 | Bruning et al. |
| 4,935,046 | A | 6/1990 | Uchikawa et al. |

(Continued)

FOREIGN PATENT DOCUMENTS

| | | |
|---|---|---|
| EP | 0 319 736 | 6/1989 |
| EP | 0319736 A1 | 6/1989 |

(Continued)

OTHER PUBLICATIONS

Chinese Office Action for Chinese Patent Application No. 200880115171.1 mailed Feb. 28, 2012.
(Continued)

*Primary Examiner* — Matthew Song
(74) *Attorney, Agent, or Firm* — Joseph E. Waters

(57) ABSTRACT

There is provided a quartz glass article having a surface treated with novel coating materials which provides a reduced chemistry, wherein the quartz glass surface having a reduced chemistry upon exposure to melted silicon or similarly corrosive environments, forms crystalline structures covering at least 30% of the coated surface of the quartz glass crucible. Said crystalline covered surface provides a more stable surface of contact with the silicon melt and the growth of single crystal silicon. In one embodiment of the invention, the coating material comprises at least a methyl group for providing at least one of a hydrogenated and a methylated surface on the coated surface, forming rosette structures, or other crystalline morphologies covering at last 80% of the coated surface. In another embodiment of the invention, the coating material is selected from at least one of an amine, an organosilane halogen and mixtures thereof.

11 Claims, 4 Drawing Sheets

(56) References Cited

U.S. PATENT DOCUMENTS

| | | |
|---|---|---|
| 4,956,046 A | 9/1990 | McNeilly |
| 5,976,247 A | 11/1999 | Hansen et al. |
| 6,280,522 B1 | 8/2001 | Watanabe et al. |
| 6,302,957 B1 | 10/2001 | Ito et al. |
| 6,428,675 B1 * | 8/2002 | Tomaswick .................. 205/372 |
| 6,712,901 B2 | 3/2004 | Tsujimoto et al. |
| 6,911,080 B2 | 6/2005 | Kishi et al. |
| 2003/0012898 A1 | 1/2003 | Kemmochi et al. |
| 2003/0211335 A1 | 11/2003 | McNulty et al. |
| 2004/0103841 A1 * | 6/2004 | Tsujimoto et al. ............ 117/200 |
| 2005/0178319 A1 | 8/2005 | Korus et al. |
| 2005/0235907 A1 | 10/2005 | Ohama et al. |

FOREIGN PATENT DOCUMENTS

| | | |
|---|---|---|
| EP | 1 304 399 | 4/2003 |
| EP | 1304399 A | 4/2003 |
| EP | 1 408 015 | 4/2004 |
| EP | 1408015 A2 | 4/2004 |
| JP | 08-002932 | 1/1996 |
| WO | 2007047783 | 4/2007 |

OTHER PUBLICATIONS

Chinese Office Action for Chinese Patent Application No. 200680047530.5 mailed Jul. 5, 2012.

* cited by examiner

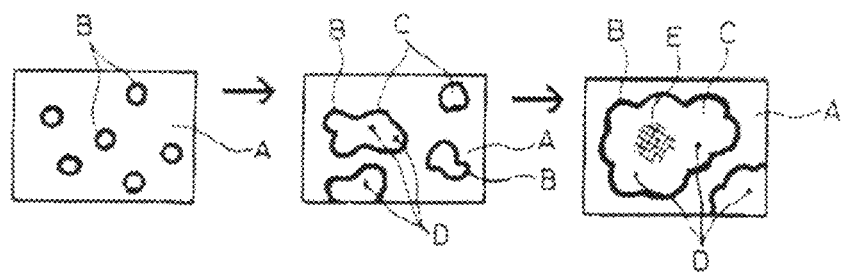
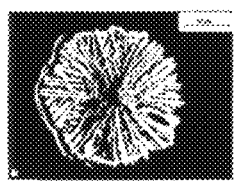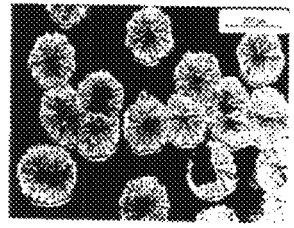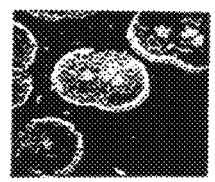
FIGURE 1
FIGURE 2
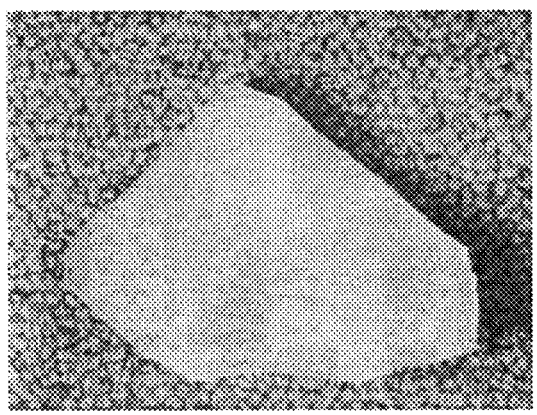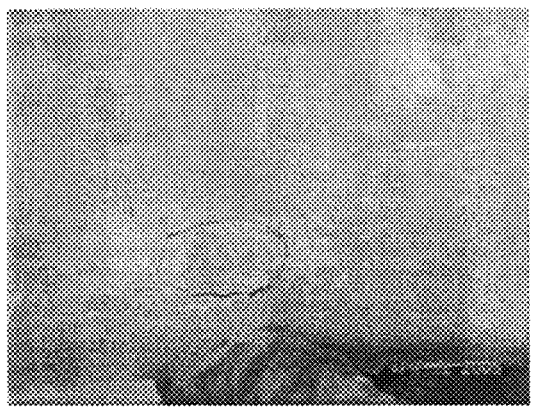
FIGURE 3    FIGURE 4

QUARTZ GLASS CRUCIBLE AND METHOD FOR TREATING SURFACE OF QUARTZ GLASS CRUCIBLE

CROSS REFERENCE TO RELATED APPLICATIONS

This application is a continuation-in-part of U.S. patent application Ser. No. 11/550,646 filed Oct. 18, 2006, now abandoned, a continuation-in-part of Ser. No. 11/550,666 filed Oct. 18, 2006, now abandoned and a continuation-in-part of Ser. No. 11/550,680 filed Oct. 18, 2006, now abandoned, the entire contents of which are incorporated herein by reference.

FIELD OF THE INVENTION

The present invention relates to quartz glass articles, including quartz glass crucibles used for pulling a silicon single crystal in the semiconductor industry, and methods for treating the surface of quartz glass articles.

BACKGROUND OF THE INVENTION

Single crystal silicon, which is the starting material for most semiconductor electronic component fabrication, is commonly prepared by the so-called Czochralski ("Cz") method. Using the Cz method, the growth of the crystal is carried out in a crystal-pulling furnace, wherein polycrystalline silicon ("polysilicon") is charged to a crucible and melted by a heater surrounding the outer surface of the crucible sidewall. A seed crystal is brought into contact with the molten silicon and a single crystal ingot is grown by extraction via a crystal puller. In this pulling process, the quartz glass crucible is subjected for several hours to high temperatures. During that time, the quartz glass crucible raised up through the glasses strain temperature so that before it reaches that temperature it must endure the thermo-mechanical stress and strain. As the temperature is raised above that point, i.e., 1100° C., the viscosity of the glassy silica ($SiO_2$) continues to decrease. At 1421° C. and higher, the glass begins to flow like the high viscosity liquid that it is. Once the polysilicon charge begins to melt, the liquid silicon begins to dissolve the $SiO_2$ crucible, solvating the inner surface and gradually etching silica material off of that inner surface. The crucible must endure these reactions during a typical meltdown and crystal pulling process cycle. The larger the crucible and thus the volume of melt to be received therein, the longer the melting times usually are.

U.S. Pat. No. 5,976,247 discloses a process to enhance the thermal stability of the quartz glass crucible, wherein the crucible is provided with a surface layer of cristobalite. The melting point of cristobalite of about 1720° C. is much higher than the melting temperatures of conventional semiconductor materials (e.g., 1420° C. for a silicon melt) though only somewhat higher than the "melting point" of amorphous silica glass at approximately 1600-1610° C. To generate the cristobalite surface layer, the glassy outer wall of a quartz crucible is treated with a chemical solution containing substances that are conducive to the devitrification of quartz glass into cristobalite ("crystallization promoters"), e.g., alkali metals, alkaline-earth metals, heavy transition metals and barium hydroxide or barium carbonate. When the quartz glass crucible is heated up to a temperature exceeding 1420° C., the surface of the pre-treated crucible wall crystallizes as it transforms to cristobalite, resulting in a quartz glass crucible with better properties for Czochralski crystal growth. The devitrification is persistent and provides an improved degree of control to the dissolution of the crucible surface.

U.S. Patent Publication No. 2005/0178319 discloses providing a quartz glass crucible with a crystallization promoter containing a first alkali-metal component acting as a network breaker and/or network modifier in quartz glass, and a second alkali-metal free component acting as a network former in quartz glass, e.g., an oxide that forms 4 bonds and can form a tetrahedral structure. Examples of these compounds are barium titanate, barium zirconate or a mixture thereof. U.S. Publication No. 2003/0211335 discloses providing a fused quartz article such as a crucible, with enhanced creep resistance by controlled devitrification, specifically by coating the crucible with a colloidal silica slurry doped with metal cations such as barium, strontium, and calcium, to promote nucleation and growth of cristobalite crystals thus prolonging the life of the quartz article.

For the silicon melt to dissolve the crucible, it must reduce the surface of the silica ($SiO_2$) first breaking one of the bonds to form silicon monoxide (SiO), then break up the remaining bond to the network which connected the SiO to the surface of the bulk silica, and finally solvate the individual SiO particles. In U.S. Pat. No. 6,280,522, it is disclosed that quartz crucibles, after extended use, develop small ring like patterns (B) on the surface (A) in contact with the silicon melt, and as time elapses, the patterns change in shape and grow in size as illustrated in FIG. 1. A better description of the phenomena is that surface nuclei form for the growth of crystalline cristobalite (C) species. These small crystal nuclei grow into disk shaped rosette structures (C). The outer perimeter of those disks is oftentimes a light brown or tan color (B), as the outer edge is apparently being reduced and dissolved into the melt faster than the inner portions on the surface of the rosette disk. Sometimes inner portions of the disk come out as tiny specks into the melt (D). Eventually the inner surface region of the rosette disk is dissolved away to expose the glassy surface beneath the crystobalite (E). And, the glassy surface tends to dissolve much more non-uniformly and more quickly than the crystobalite disk. Eventually the inner region expands outward until it reaches the perimeter where the brown ring is located. At this point, the entire crystobalite disk has been eroded away to expose a rough irregular glass surface which can sluff fragments quite easily.

While just the crystalline portion is being eroded away, it comes loose as microscopic fragments which generally dissolve easily. Once the center is dissolved away, it may come loose as larger fragments, since the interface layer between the crystalline portion and the underlying glassy material is dissolved away, undercutting the crystalline material. It should be noted that that interface is naturally weaker since there is a difference in the specific volumes of the crystalline species and the amorphous glassy species. This results in the chemical bonds between the two being strained. It then may contribute particle fragments to the molten silicon. And as the glass surface (E) is eroded or dissolved, it also dissolves non-uniformly and is very likely to let loose particles into the melt which are apt to cause dislocations in the silicon crystal growth and thus reducing the yield. The "brown ring" (B) as illustrated in U.S. Pat. No. 6,280,522 is believed to be silica $SiO_2$ that is reduced to SiO. FIG. 3 is a photograph taken at normal (~1×) magnification showing the brown rings on the surface of an untreated crucible after one crystal pulling run, with individual rosettes as well as small clusters of rosettes.

Upon close examination of the brown rings in FIG. 3, one observes individual rosettes (as shown in FIG. 2) having low nucleation density with the brown rings being deposits of SiO left on the edge of rosettes. Over time, the rosettes begin to merge with the radial growth increasing until they bump into one another, thus expanding the size of the brown rings of FIG. 1. Eventually, portions of the rosettes begin to flake out, and very often it is the center of the rosettes which begin to flake out as illustrated in FIG. 4, thus causing pitting corrosion.

Today's perfect silicon crystal is grown under conditions where every effort is made to get a crystal structure as perfect as possible. This is done so as to minimize the number of interstitials as well as the number of silicon vacancies. However, even the best attempts to approach thermodynamic/slow growth conditions still incorporate the vacancies. Since interstitials and vacancies cannot be eliminated completely, there is a need to reduce the strain on such a lattice with improved quartz glass crucibles. In one embodiment of the invention, a coating comprising at least a thin film of germanium based species are used for quartz glass crucibles that can be of advantage to the crystal grower.

There is also a need for an improved method to extend the life of quartz crucibles for use in silicon crystal growth. The focus in the prior art has been the reduction in the formation of the rosettes with brown rings. The invention relates to methods to extend the life of quartz crucibles by nucleating other crystalline growth and improving the condition of the rosettes, and contrary to the prior art teaching by increasing the number of rosettes with brown rings formed on quartz crucibles.

SUMMARY OF THE INVENTION

In one aspect, the invention relates to a method to extend the life of a quartz glass crucible by coating a surface of the quartz glass crucible with a coating material which provides a reduced chemistry on the surface of the quartz glass crucible, wherein said quartz glass surface having a reduced chemistry upon exposure to melted silicon forms rosettes covering at least 30 percent of the coated surface of the quartz glass crucible.

An embodiment of the invention provides a glass article comprising a surface having coated thereon a coating material providing a plurality of chemical species having a reduced chemistry on the coated surface, wherein the glass article having a coated surface with a reduced chemistry has a service life of at least 10 percent longer than a quartz glass article not treated with the coating material, wherein the quartz glass article contains at least 99.0 percent $SiO_2$.

In an embodiment of the invention provides a glass article comprising a surface having coated thereon a coating material providing at least one chemical species having an average electronegativity [i.e., Pauling's electronegativity] value per atom that is less than the average electronegativity value per atom of $SiO_2$, to provide reduced chemistry on the coated surface, wherein the quartz glass article contains at least 99.0% $SiO_2$.

In one embodiment of the invention, the coating material comprises at least a methyl group for providing at least one of a hydrogenated and a methylated surface on the coated crucible, forming rosettes covering at last 30% of the coated surface of the quartz glass crucible. In another embodiment, the coating material is selected from at least one of an amine, an organosilane halogen (organohalosilane) and mixtures thereof. In yet another embodiment, the coating material comprises at least a methyl group.

In one aspect, the invention further relates to a method to extend the life of a quartz glass crucible by coating a surface of the quartz glass crucible with a coating material with at least one of: a) effecting a dispersal of crystalline silicon dioxide nuclei in a gel film containing a silane or germane compound; b) effecting a reduced chemistry on the surface of the quartz glass crucible by the application of a silane or germane compound with reducing capability; and c) an amount of a germanium compound that is at least sufficient to effect a relief of tensile stresses in the grown silicon crystal, wherein the quartz glass surface upon exposure to melted silicon forms rosettes or crystalline morphology covering at least 30% of the coated surface of the quartz glass crucible.

In one embodiment, the coating material comprises at least a crystalline silicon dioxide species for providing physical nuclei on the surface of the coated crucible, forming a crystalline surface coverage or rosettes covering at last 30% of the coated surface of the quartz glass crucible.

In another embodiment, the coating material is selected from at least one of an alkyl silane, an amino silane, an alkyl-alkoxy-silane, an alkyl germane, an amino germane, an alkyl-alkoxy-silane, an alkyl amino silane, an amino-alkoxy-silane, an alkyl amino germane, an amino-alkoxy-germane, an alkyl halogen silane, an alkyl halogen germane, and mixtures thereof. In yet another embodiment, the coating material comprises at least a physical nuclei, an alkyl silane, an alkyl germane, an alkoxysilane, and alkoxygermane, an alkyl-alkoxy-silane, an alkyl-amino-silane, an amino-alkoxy-silane, an alkyl-amino-germane, an amino-alkoxy-germane, an alkyl-halogen-silane, an alkyl-halogen-germane, an alkyl-alkoxy-germane, or possible mixtures thereof.

In yet another aspect, the invention relates to a process to extend the life of quartz glass articles by varying the reduction/oxidation state of the surface of the crucibles in a surface treating process. The inner surface of the crucible is coated in a manner with a material which provides the quartz surface with a dispersal of crystalline silicon dioxide compounds to act as nuclei for crystal growth. In one embodiment, additional compounds are used to act as a gel or film to hold those physical nuclei in place, for reducing compound structures that are more chemically reduced than $SiO_2$ to form additional nuclei when the quartz glass surface is used in operation.

In still another aspect, the invention provides a glass article in the form of a crucible for use in growing single silicon crystal in a Czochralski operation, wherein the single silicon crystal obtained contains at least 10 percent more single crystal silicon material yield than a single crystal silicon yield obtained absent said coating material.

DESCRIPTION OF THE DRAWINGS

FIG. 1 is a sketching or view showing examples of stages of formation of brown rings and devitrified specks, observed on an inner surface of a conventional quartz glass crucible.

FIG. 2 is a series of Microphotographs taken at approximately 100× magnification (scale showing the proportionate length of 250 μm), showing the rosette crystal structure nucleation stages from an individual "rosette" (the inner part of a brown ring), merged rosettes, and finally forming devitrified specks with center flake out, as observed on an inner surface of a conventional quartz glass crucible.

FIG. 3 is a photograph taken with a camera at approximately 1× magnification, illustrating a coupon sample from a conventional quartz glass crucible made without any coating, an untreated crucible of the prior art, showing a close up picture of "brown rings" containing rosettes on an inner surface of the crucible.

FIG. 4 is a photograph taken at 1 to 2× magnification as a slight close-up (note finger tip for size reference), showing a close up of a rosette formed on the surface of an untreated crucible of the prior art, with the center of the rosettes showing evidence of flake-out which is shown as the rough or dull discoloration area within the rosettes.

DETAILED DESCRIPTION OF THE INVENTION

Figure 5:
FIG. 5 is a photograph taken at approximately 1× or normal magnification, illustrating a coupon sample from a crucible made with one embodiment of the coating of the invention, showing the dense formation of "brown rings" containing the robust rosettes as form in the area with applied coating.

As used herein, the term "treated" or "coated" may be used interchangeably to refer to treating the crucible surface with the coating of the invention, leaving substantially all of the quartz glass crucible surface (to be in contact with the silicon melt) substantially in either a fully reduced, partially reduced, partially oxidized or fully oxidized state.

Other than in the working examples or where otherwise indicated, all numbers expressing amounts of materials, reaction conditions, time durations, quantified properties of materials, and so forth, stated in the specification and claims are to be understood as being modified in all instances by the term "about."

It will also be understood that any numerical range recited herein is intended to include all sub-ranges within that range and any combination of the various endpoints of such ranges or sub-ranges.

It will be further understood that any compound, material or substance which is expressly or implicitly disclosed in the specification and/or recited in a claim as belonging to a group of structurally, compositionally and/or functionally related compounds, materials or substances includes individual representatives of the group and all combinations thereof.

As used herein, the term "Redox coating materials," or "Redox coating" (Reduction-Oxidation) refers to a gel or film of coating material or a reactant (which may in fact create a molecular monolayer) for use in treating the surface of the quartz glass crucible in one embodiment. In one example, the coating refers to an application of a dispersion of crystalline $SiO_2$ nuclei over the surface. In a second example, a coating of a sol or gel or film that is reduced relative to fully oxidized $SiO_2$, e.g., an alkoxysilane gel, an alkoxygermane gel, an alkyl-alkoxy-silane, an alkyl-alkoxy-germane, etc. In another example, the coating comprises a Lewis acid (metal or semi-metal chloride) that reacts at or near room temperature with the surface of the $SiO_2$ crucible, directly binding the hetero-atoms to the quartz glass surface. In yet a fourth example, the coating comprises a plurality of layers comprising any of the above examples.

As used herein, the term "substantially all of quartz glass crucible surface" indicates that the selected coating, e.g., a nucleation coating, a Redox coating, a Lewis acid coating, etc., is applied to cover a sufficient portion of the intended surface to provide the desired controlled reduction/oxidation state. Also as used herein the terms "substantially" or "a sufficient portion" indicates that the quartz surface in contact with the silicon melt is at least 75% covered by the coating in one embodiment. In a second embodiment, at least 90% coated.

In one embodiment, the coated crucible surface in contact with the silicon melt is at least 30% covered by brown rings having the rosette formation, or alternatively at least 30% covered by an alternate crystalline formation. In another embodiment, the coated crucible surface in contact with the silicon melt is at least 50% covered by brown rings having the rosette formation, or alternatively at least 50% covered by an alternate crystalline formation. In yet another embodiment, the crucible surface in contact with the silicon melt is at least 75% covered by brown rings having the rosette formation and/or crystalline morphology structures. In still another embodiment, the crucible surface in contact with the silicon melt is at least 80% covered by brown rings having a robust rosette formation and/or crystalline morphology structures. In a further embodiment, the coated surface is at least 90% covered by rosettes and/or crystalline morphology structures.

As used herein, the terms "first," "second," and the like do not denote any order or importance, but rather are used to distinguish one element from another, and the terms "the", "a" and "an" do not denote a limitation of quantity, but rather denote the presence of at least one of the referenced item. Furthermore, all ranges disclosed herein are inclusive of the endpoints and are independently combinable.

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

As used herein, "quartz glass articles" may be used interchangeably with "quartz glass crucibles," "quartz crucibles," "fused quartz crucibles," and "quartz crucible," referring to glass articles that may be subjected for extended period of time to high mechanical, chemical, and thermal stress, high thermo-mechanical stress and strain, high temperatures, reactive melts, and melts which can solubilize the quartz crucible to a measurable and sometimes significant extent, and if used for crystal pulling, exposed to molten silicon.

As used herein, the term "substantially continuous" refers to continuity with or without insignificant breaks.

As used herein, the term "crystalline morphology" may be used interchangeably with "crystalline growth structure." The definition of morphology, as known in the art, can be defined at a macroscopic or microscopic level. In one embodiment, "crystalline morphology" refers to a region wherein the glassy (amorphous) $SiO_2$ has crystallized into one or more of the several crystalline phases of $SiO_2$, e.g., crystobalite, tridymite, quartz, etc. These phases may appear or present themselves in different macroscopic structures or shapes. At the microscopic level, the term is defined by the actual crystallite growth faces presented, e.g., crystallite may be presented by 1-0-0, 0-1-0, and 0-0-1 oriented growth faces.

As used herein, the term "rosettes" refers to the hemispherulite growth structure or morphology where it is a hemispherical growth outward from a central nucleus with a flattened depth dimension due to the high viscosity of quartz, therefore having a flattened disk shaped crystal structure. This crystalline structure is usually present with the boundaries of "brown rings" or deposits of SiO left on the edge of rosettes. These structures are sometimes called brown rings.

As used herein, the term crystalline surface structures refers to any and all crystalline phases of $SiO_2$, including or not limited to crystobalite, quartz alpha, quartz beta, tridymite, and others.

Applicants have discovered that the formation of the (SiO) brown rings themselves may be unrelated to the crystal yield. Instead, it is believed that it is the rosette density, quality and condition of the rosettes that correlates to the crystal yield. In one embodiment, the life of quartz crucibles is extended by nucleating the crystalline growth and improving the condition of the rosettes. Additionally and contrary to the prior art teaching, the life is extended by increasing the number of brown rings formed on quartz crucibles. Sometimes this can be done to the extent, that the brown rings are no longer visible because the rosettes formed are so dense that they have grown into one another at the edges and the resulting surface is one where it is substantially covered by the rosette disks which are abutting edge to edge. In one embodiment, the quartz glass article life is extended by varying the reduction/oxidation state of the surface of the crucibles in a surface treating process. The inner surface of the glass article, e.g., a crucible is coated with a chemical compound which provides an inner surface (at the molecular level) with a species or group that is more reduced than $SiO_2$. In one improvement, the quartz glass crucible coating incorporates a sufficient amount of germanium substituting for silicon to put a small amount of compression on the lattice, compensating to some degree for the tension put on it by the presence of vacancy clusters in the grown silicon crystal.

The theories of underlying reasons for the rather unexpected activities of the surface modification process effecting a reduced chemistry on the surface of a quartz glass crucible of this invention have been explored. While applicants do not wish to be limited to theoretical reasoning, it is believed it may be helpful to a further understanding of the attributes and unexpected results achieved according to this invention. It is presently believed, that the surface of the quartz glass crucible ($SiO_2$) can be partially and/or fully chemically reduced with various compounds that effect electronegativity of the surface silica (i.e., Pauling's theory which describes electronegativity of an element as the electron-attracting power of an element in a compound or the power of an atom in a molecule to attract electrons to itself).

The average electronegativity, i.e., Pauling's electronegativity, value per atom is calculated as the sum of the electronegativity for each of the atoms in the molecule divided by the number of atoms present in the molecular group to give a net estimate of the electronegativity for that molecular species. According to an embodiment of the invention, chemical reduction of the surface silica can be performed with the use of compounds which are less electronegative than oxygen, or more specifically, with compounds that possess substituents/groups that have an average electronegativity per atom which is less than the average electronegativity per atom of surface $SiO_2$ of the quartz glass.

Pauling's theory of electronegativity is a commonly used method of calculating electronegtivety which gives a dimensionless quantity on a relative scale running from approximately 0.7 to 4.0. The electronegativity is an average value determined from relative bond energies of compounds and a single value is generally used for each element, irrespective of oxidation state. Examples of Pauling's electronegative values include, e.g., hydrogen having an electronegativity value of 2.2, oxygen having an electronegativity value of 3.44 and nitrogen have a value 3.04.

Figure 9:
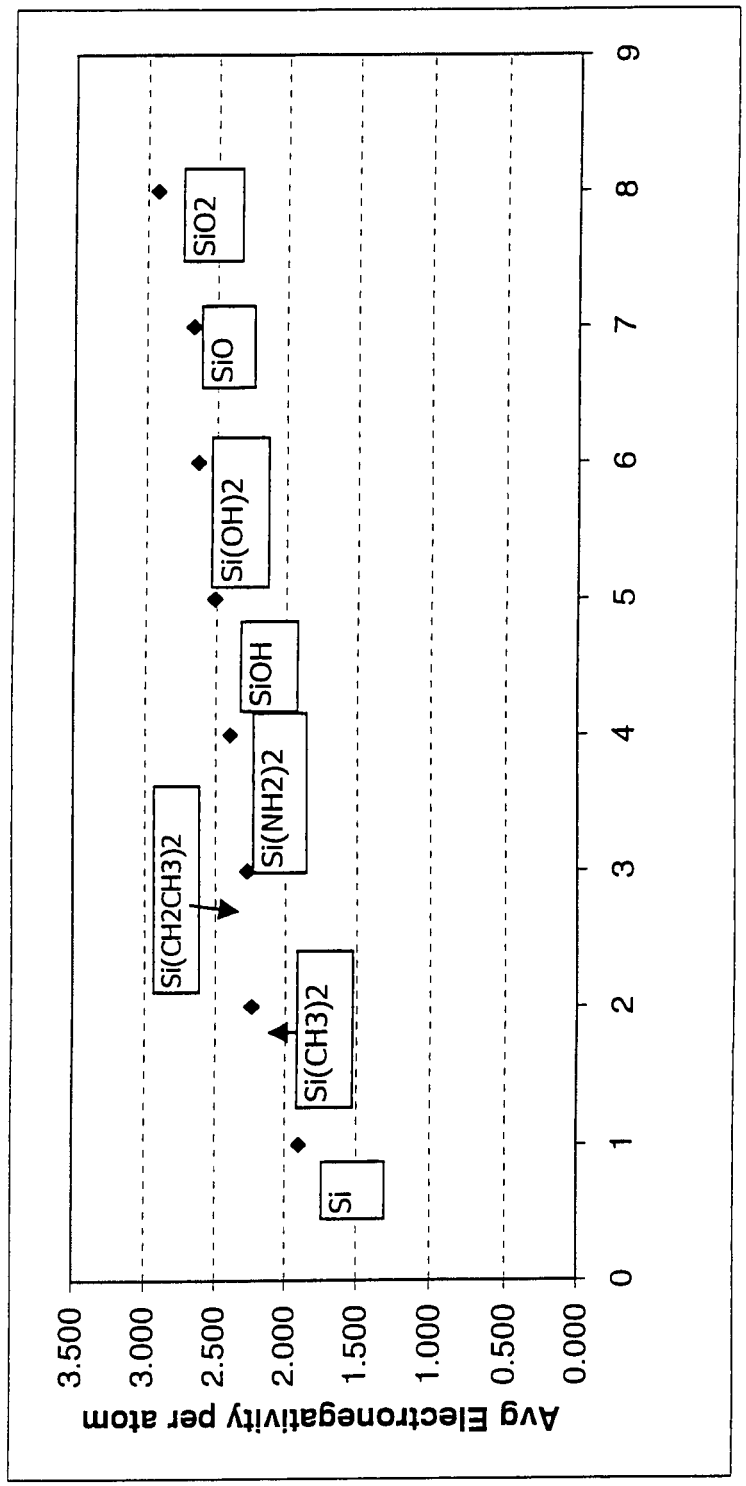
FIG. 9 is a graphical representation of the average electronegativity value per atom of various compounds having different substituents or attached groups that are less than the average electronegativity value per atom of $SiO_2$.

In one embodiment of the invention, the inner surface of the glass article, e.g., a crucible, is coated with a compound(s) possessing substituents/groups that have an average electronegative value per atom that is less than the average electronegative value per atom of $SiO_2$ of the glass article surface. According to an embodiment, these substituents/groups possess an average electronegativity value per atom which less than the average electronegativity value per atom of $SiO_2$, i.e., 2.927. The average Pauling's electronegative values for various compounds can be obtained by averaging the electronegativity per atom as described above, e.g., the electronegativity value for Si is 1.90, thus the average electronegativity value for $SiO_2$ can be obtained by adding 1.90 and 6.88 (the electronegativity value for $O_2$) and dividing by the number of atoms, i.e., 3 for an average electronegativity value of 2.927. The average electronegativity value for $Si(NH_2)_2$ can be obtained by adding 1.90 (electronegativity value for Si) and 14.88 (the electronegativity value for $(NH_2)_2$) and dividing by 7, the number of atoms, for an average electronegativity value of 2.397. According to another embodiment, suitable compounds that are useful in the coating materials of the invention are those having an average electronegativity value per atom, such as, for example, SiO (2.670), $Si(OH)_2$ (2.636), SiOH (2.513), $Si(NH_2)_2$ (2.397), $Si(CH_2CH_3)_2$ (2.273), $Si(CH_3)_2$ (2.244), Si (1.90), respectively. A graphical representation of the average electronegativity values per atom of various compounds relative to $SiO_2$ are presented in FIG. 9.

Figure 7:
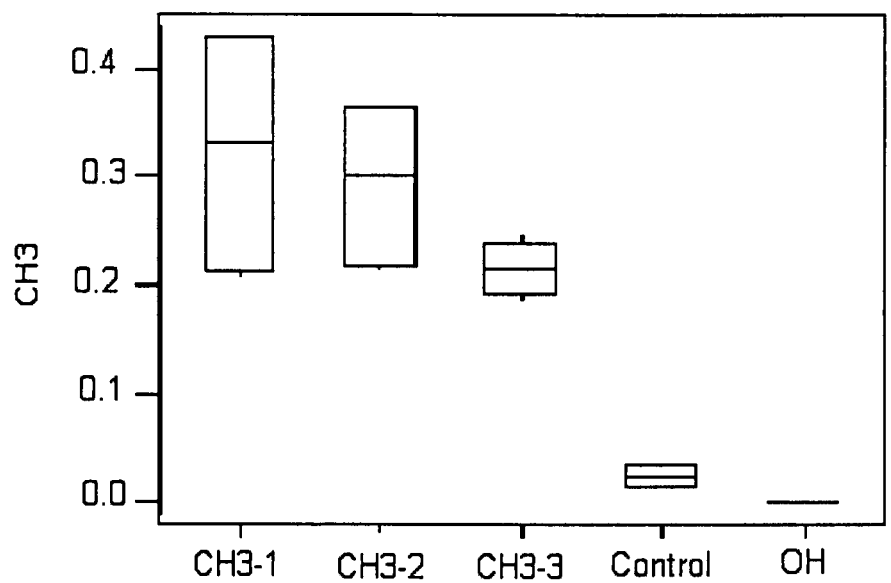
FIGS. 7 and 8 are graphs illustrating analytical results of an embodiment of a comparative test to detect the presence of a reduced chemistry on the crucible.
Figure 8:
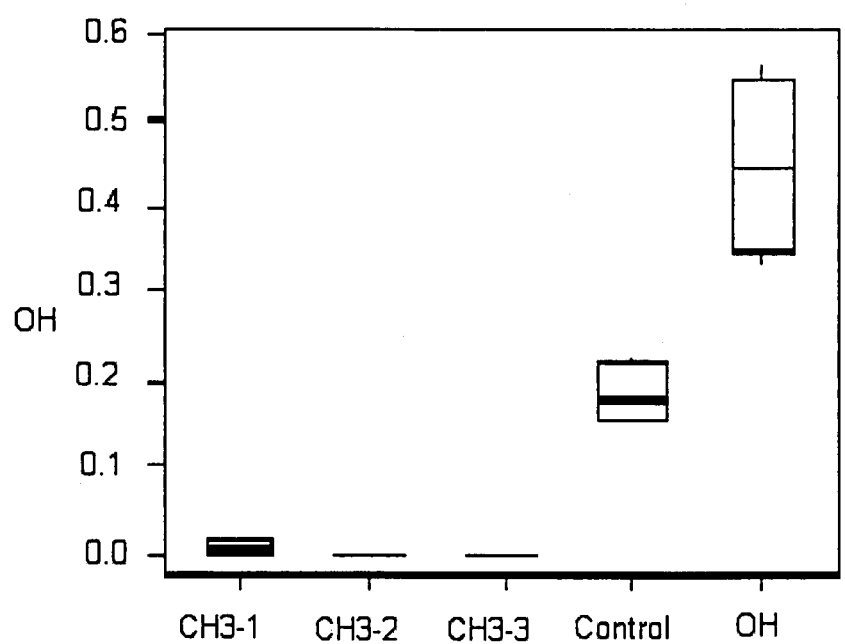

The presence of the coating layer with a reduced chemistry can be tested by known methods, with tests tailored to detect the plurality of reduced species comprising the reduced surface the testing can be tailored to the potential various reduced coating species. For example, for the detection of a coating surface comprising methylated groups, the coating surface can be analyzed spectrometrically by low angle IR absorbance. FIGS. 7 and 8 are graphs illustrating analytical results of a test comparing a methylated coating on a quartz crucible vs. a reference standard (crucible with no coating) and a $SiO_2$ crucible surface that was treated to increase the amount of OH on the surface.

According to an embodiment, a process for preparing a single silicon crystal is provided from the quartz glass article having a surface treated with the novel coating materials of the invention which provides a reduced chemistry upon exposure to silicon melt, for use in a silicon crystal pulling operation, produces a single silicon crystal that is at least about 10 percent larger than a single silicon crystal obtained from a glass quartz article absent said coating material. According to another embodiment, a process for preparing a single silicon crystal is provided from the quartz glass article having a surface treated with the novel coating materials of the invention which provides a reduced chemistry upon exposure to silicon melt, for use in a silicon crystal pulling operation, produces a single silicon crystal that is at least about 15 percent larger than a single silicon crystal obtained from a glass quartz article absent said coating material. In yet another embodiment, a process for preparing a single silicon crystal is provided from the quartz glass article having a surface treated with the novel coating materials of the invention which provides a reduced chemistry upon exposure to silicon melt, for use in a silicon crystal pulling operation, produces a single silicon crystal that is at least about 20 percent larger than a single silicon crystal obtained from a glass quartz article absent said coating material.

Quartz Glass Crucibles as Starting Materials. Quartz glass articles suitable for use as "starting materials" for surface treating according to the method of the invention are known. In one embodiment, the quartz glass article is in the form of a quartz tube, e.g., for use in the fiber optics industry in the production of optical quality glass boules. In another embodiment, the quartz glass article is in the form of a fused quartz crucible, produced using a method as disclosed in U.S. Pat. No. 4,416,680, the contents of which are incorporated herein by reference.

In another embodiment, the quartz article is in the form of a quartz crucible that has been treated with a crystallization promoter in any of the processes known/disclosed in the art, including U.S. Patent Publication Nos. 2005/0178319 and 2003/0211335, and Japanese Patent Publication No. 08-002932. In yet another embodiment, the quartz crucible is fused using synthetic silica made with residual nitrogen content, for a devitrified inner surface that is uniformly crystallized as disclosed in U.S. Pat. No. 6,280,522. The entire contents of the forgoing references are incorporated herein by reference.

Embodiments of Redox coatings: In one embodiment of the invention, the quartz article, e.g., a crucible, is coated with a material comprising methyl groups, wherein the hydrogen atoms and the carbon atoms both provide a reduced chemistry relative to the normal oxygen and OH groups on the crucible surface. In another embodiment, the Redox coating comprises a material containing a substituted silane, which provides a hydrogenated or methylated surface on the silica which would help "control" the crucible surface for optimized stable performance when used in a crystal puller. In yet another embodiment, the coating comprises alkyl and alkoxy silanes, which provides a silane sol that gels and provides a coating that is partially Si—O based and partially organic based. This embodiment is still chemically reduced relative to a fully oxidized $SiO_2$ surface. The tails or ligand ends that are more reduced are the alkyl groups linked directly to the Silicon center. Note that in this case the film is reduced. But further reduction reactions take place as the crucible is heated up, the gel coating undergoes some decomposition, and the resulting carbon and hydrogen rich thin film is able to reactively bind to the $SiO_2$ surface below it and thus effectively create the fully bound and reduced inner surface.

In one example, methyl-trimethoxysilane is used to leave a reduced surface film treatment. In other examples, tetramethoxysilane, tetraethoxysilane, tetrapropoxysilane and other cognates can be used to leave a reduced film, catalyzing the formation of a crystalline surface or of a denser coating of rosettes.

In one embodiment, the Redox coating comprises at least one of an anhydrous ammonia, an amine, or mixtures thereof, dissolved in a non-aqueous solvent. In one embodiment, the coating comprises at least an amine selected from the group of alkylamines, aminoalkylamines, hydroxyalkylamines, mercaptoalkylamines and aminoalkyl silanes, and aminosilanes. In one embodiment, the amine may be a mono-amine such as $RNH_2$, $R_2NH$ or $R_3N$ where R has 1 to 36 carbon atoms and may be alkyl, cycloalkyl alkenyl, aryl or aralkyl amines, e.g., methyl, ethyl, propyl, octyl, dodecyl, octadecyl, propylene, butylene, phenyl, ethylphenyl or benzyl. In another embodiment, the amine may be selected from the group of diamines such as $H_2N$—$R_1$—$NH_2$ wherein $R_1$ is an alkylene group of 2 to 36 carbon atoms, e.g., ethylene diamine, propylene diamine, butylene diamine, hexylene diamine, dodecenyl diamine or a diamine derived dimer and wherein $R_1$ is a polyamine, e.g., triethylene tetramine; hydroxyalkylamines having an alkyl group of 2 to 18 carbon atoms, e.g., ethanolamine, diethanolamine, N-methyl ethanolamine, 2-hydroxypropylamine, hydroxyethyl-stearylamine; mercaptoamines, e.g., mercaptoethylamine or mercaptopropylamine; amino, diamino or triamino trialkoxy silanes with alkyl, cycloalkyl or aralkyl groups between the silane group and the proximate amino group, and between the amino groups in the case of the diamino or triamino derivatives, for example, $H_2$ $NRNHR_1$ $Si(OR_2)_3$ or $H_2NRSi(OR_2)_3$ wherein R and $R_1$ are defined as above and $R_2$ is an alkyl group of 1 to 4 carbon atoms. In one embodiment, the amine is selected from the group of aminotrialkoxy silanes, such as aminoethyl trimethoxysilane, aminopropyl trimethoxysilane, carbethoxyaminoethyl trimethoxysilane or aminoethyl aminopropyl trimethoxysilane ($H_2 N.CH_2CH_2NHCH_2 CH_2CH_2Si(OCH_3)_3$).

Examples of suitable amines for use in the Redox coating include methylamine $CH_3$—$NH_2$, ethylamine $CH_3CH_2$—$NH_2$, dimethylamine $CH_3NHCH_3$, triethylamine $(CH_3CH_2)_3$ N, and trimethylamine $(CH_3)_3N$.

Suitable solvents for dissolving the ammonia or amines include saturated aliphatic alcohols, in one example, containing no more than 10 carbon atoms, aliphatic and aromatic hydrocarbons, ethers, aliphatic and aromatic nitriles and aromatic amines. Examples include methanol, ethanol, n-butanol, t-butanol, n-octanol, n-decanol, ethylene glycol, hexane, decane, isooctane, benzene, toluene, the xylenes, tetrahydrofuran, dioxane, diethyl ether, dibutyl ether, bis(2-methoxyethyl)ether, 1,2-dimethoxyethane, acetonitrile, benzonitrile, aniline, phenylenediamine and p-phenylenediamine. In one embodiment, aniline is used as the solvent.

In one embodiment, the Redox coating comprises an alkyl magnesium halide, e.g., 1 to 10 carbons containing alkyl magnesium chlorides and bromides. Non-limiting examples of alkyl groups include methyl, ethyl, propyl, isopropyl, butyl, isobutyl, pentyl and hexyl. Other embodiments include, the Redox coating comprising alkyl calcium halide, alkyl strontium halide, and alkyl barium halide. Other embodiments include more generally alkyl metal halides.

In yet another embodiment, the Redox coating comprises at least an organosilane halogen, i.e., an organosilane or organo-functional-silane wherein at least a halogen is bonded to the Si, some examples include, but are not limited to, $(alkyl)2SiCl_2$, $(alkyl)SiCl_3$, $(alkyl)_3SiCl$, an $(alkyl)_2SiBr_2$, an $(alkyl)_2SiF_2$, or an aryl group instead of the alkyl groups such as $(aryl)_2SiCl_2$. Examples include $(CH_3)_2SiCl_2$, $(CH_3)_2 SiBr_2$, $(CH_3)_2SiI_2$, $(CH_3)_2SiF_2$, $CH_3SiH_2Cl$, $(CH_3)SiCl_3$, $(CH_3)SiBr_3$, $(CH_3)SiI_3$, $(CH_3)SiF_3$, $SiHCl_3$, $SiH_2Cl_2$, $(CH_3)_3 SiCl$, $(CH_3)_3SiBr$, $(CH_3)_3SiI$, $(CH_3)_3SiF$, $SiHCl_3$, $(CH_3 CH_2)_2SiCl_2$, $(C_2H_5)_3SiCl$, $(CH_3CH_2CH_2)_2SiCl_2$, $((CH_3)_2 CH)_2SiCl_2$, $((CH_3)_2CH)SiCl_3$, $((CH_3)_2CH)_3SiCl$, $(C_2H_5)_2Si$-$HCl$, $(CH_3CH_2CH_2CH_2)_2SiCl_2$, $((CH_3)_2CHCH_2)_2SiCl_2$, $(CH_3CH_2CH_2CH_2)SiHCl_2$, $((CH_3)_3C)_2SiCl_2$, $(C6H6)_2 SiCl_2$; siloxanes such as $(CH_3)SiCl_2OSi(CH_3)_3$, $(CH_3) SiCl_2O(CH_3)_2SiCl$, $(CH_3)SiCl_2O(CH_3)_2SiCl_2$, $(CH_3CH_2) SiCl_2O(CH_3CH_2)_3Si$, and $(CH_3CH_2)$ $SiCl_2O(CH_3CH_2)_2 SiCl$; $(CH_3O)_2SiCl_2$, $(CH_3CHO)_2SiCl_2$. In one embodiment, the Redox containing comprises at least one of dichlorosilane $SiH_2Cl_2$ and dichlorodimethylsilane $(CH_3)_2SiCl_2$. In another embodiment, the coating is selected from one of a mono halo silane and a methyl tri halo silane. Other combinations are contemplated and the listed examples are representative, but not considered limiting.

In one embodiment, the coating is formed by reacting the hydroxylated surface of the silica on the quartz article surface with a Lewis acid such that the surface of the silica is changed to a metal or semi-metal bonded to the silica. The metal portion of the Lewis acid is an electron donor to the silica structure. As such, one chemically has a metal or semimetal silicate right at the crucible surface. This, in effect, changes the surface chemistry of the crucible so as to induce crystalline growth. The presence of the metal cations at the surface and oriented along the surface indicates that at the surface mono-layer, the surface comprises reduced species.

In one embodiment, the Lewis acid coating comprises a metal or semi-metal chloride. Examples include but are not limited to: $AlCl_3$, $ScCl_3$, $YCl_3$, $LaCl_3$, $CeCl_3$, $CeCl_4$, $CH_3MgCl$, $CH_3CaCl$, $CH_3SrCl$, $CH_3BaCl$, $HSiCl_3$, $H_2SiCl_2$, $SnCl_4$, $SnCl_2$, the iodides, the bromides, the ethyl-metal-halides, and mixtures thereof. When applied to a quartz glass article surface, these species are not just left as a deposit on the surface. As they are very strong Lewis acids, they react with the dangling OH bonds normally present on the surface of normally weathered or normally hydrated $SiO_2$, i.e., the hydroxylated surface bonds of Si—OH, thus chemically binding the metal to the surface of the silica directly.

Embodiments of Nucleation/Redox coatings: In one embodiment, the coating material further comprises a powdered crystalline material to act as physical nuclei for the crystal growth incorporated as one part of the coating composition, e.g., crystalline silica having a average particle size of less than 50 µm in one embodiment, and less than 20 µm in a second embodiment. In a third embodiment, the coating material further comprises a crystalline silica having an average particle size in the range of 1 to 5 µm. In one example, the powdered crystalline material is an alpha quartz, or a beta quartz, or a crystobalite. Powdered crystalline material sources are commercially available from various sources including Unimin Corporation.

In one embodiment, the crucible is coated with a material comprising a powdered crystalline material such as crystobalite, in a coating comprising alky or alkoxy groups, e.g., tetramethoxysilane, tetraethoxysilane, dimethoxydimethylsilane, diethyoxydimethylsilane, and mixtures thereof.

In one embodiment, the coating comprises a material containing a substituted silane or a substituted germane, which provides a methylated or alkylated surface on the silica which would help "control" the crucible surface for optimized stable performance when used in a crystal puller. In yet another embodiment, the coating comprises alkyl and alkoxy germanes, which provides a germane sol that gels and provides a coating that is partially Ge—O based and partially organic based, still chemically reduced relative to a fully oxidized SiO2 surface. The tails or ligand ends that are more reduced are the alkyl groups linked directly to the silicon center atom.

In on embodiment, the coating comprises a powdered crystalline material such as crystobalite, and one or more of tetramethoxygermane, tetraethoxygermane, dimethoxydimethylgermane, diethoxydimethylgermane, and mixtures thereof.

In one embodiment, the coating comprises halogen silanes, halogen germanes, halogen stannates, or combinations thereof. In another embodiment, the coating comprises an alky and or alkoxy tetravalent or divalent stannate, e.g., Tin (IV) and Tin(II) compounds.

In one embodiment, the coating comprises at least one of a reactive Lewis acid halide, e.g., a suitable acid halide such as $AlCl_3$; boron trifluoride, phosphorus chlorides (though in practice we would probably never use the boron compounds or the phosphorus compounds), ferric chloride (Iron III chloride), or mono, di, or trihalides of metals; a trialkylchlorogermane; a dialkyldichlorogermane, or mixtures thereof, or homologues thereof, dissolved in a non-aqueous solvent which is suitable for dissolving and diluting these species, evaporates easily and is nonreactive with the Lewis acid halides. In one embodiment, the coating comprises an dialkyldihalogensilane or a dialkyldihalogengermane.

In one embodiment, the coating comprises a Lewis acid which is a reagent similar to Grignard reagents, e.g., alkyl or aryl magnesium halide, e.g., 1 to 10 carbon containing alkyl or aryl group which may be linear or branched, cyclic, and which may carry aromatic or heterocyclic units, e.g., magnesium chlorides and bromides. Non-limiting examples of alkyl groups include methyl, ethyl, propyl, isopropyl, butyl, isobutyl, pentyl and hexyl. In yet another embodiment, the Redox coating comprising alkyl calcium halide, alkyl strontium halide, and alkyl barium halide, as these are normal Grignard reagents. In a third embodiment, the coating comprises alkyl metal halides. In one embodiment for the Lewis acid, the coating comprises a metal or semi metal plus halogen compound as hydrogen ligand groups for providing at least one of a hydrogenated and a metal bonded to the surface of the coated crucible.

In one embodiment, the coating comprises at least an organosilane halogen, or an organogermane halogen, i.e., an organosilane or germane wherein at least a halogen is bonded to the Si or Ge such as an $(alkyl)_2SiCl_2$, an $(alkyl)_2GeCl_2$, an $(alkyl)_2SiBr_2$, an $(alkyl)_2GeBr_2$, an $(alkyl)_2SiF_2$, an $(alkyl)_2GeF_2$, or an $(aryl)_2SiCl_2$, an $(aryl)_2GeCl_2$. Anions include F, Cl, Br, and I. Examples include, but are not limited to, $(CH3)_2SiCl_2$, $(CH_3)_2GeCl_2$, $(CH_3)_2SiBr_2$, $(CH_3)_2SiF_2$, $(CH_3)GeBr_2$, $(CH_3)_2GeF_2$. Obviously the organic tails can get more complicated with longer alkyl groups. In one embodiment, the Redox containing comprises at least one of dichlorosilane $SiH_2Cl_2$ and dichlorodimethylsilane $(CH_3)_2SiCl_2$.

Embodiments of solvents: Solvents for used with the nucleation coatings, the Redox coating, and the Lewis acid coatings of the invention are known in the art. Examples of suitable solvents include alkyl halides like chloroform, carbon tetrachloride, trichloroethane, trichloropropane, and similar C4, C5, C6, C7, etc. compounds. In addition, for coating compositions comprising alkoxysubstituted silanes and germanes, solvents such as methanol, ethanol, n propanol, isopropanol, n-butanol, t-butanol, n-octanol, n-decanol, ethylene glycol, hexane, decane, isooctane, benzene, toluene, the xylenes, dioxane, diethyl ether, dibutyl ether, bis(2-methoxyethyl)ether, 1,2-dimethoxyethane, etc., can be used.

In one embodiment of an organosiloxane coating, the organosiloxane is first dissolved in a solvent before application onto the surface of the glass article. Examples of suitable solvent include but not limited to hydrocarbons such as butane, pentane, hexane, etc.; chlorinated hydrocarbons such as a halogenated alkane solvent, e.g., dichloromethane, trichloromethane, tetrachloromethane, 1,2-dichloroethane, trichloroethylene; 1,1,1 trichloroethane, a tetrachloroethylene, chlorobenzene, etc., or mixtures thereof.

End-Use Applications of the Treated Quartz Glass Article: The treated quartz glass article can be used as rods, tubing, and the like, e.g., for use in the fiber optics industry in the production of optical quality glass boules. The treated quartz glass article can be as small and larger diameter tubing for use in the semiconductor industry as the tubes for diffusion furnaces. The devitrification that is formed can act to enhance the physical stability and improve the sag resistance of the tubes when used for long times in the diffusion tube processes so common in the semiconductor wafer processing industry. In one embodiment, the treated articles are quartz crucible for use in growing single silicon crystal. After treatment, the surface of the crucible is left in either a fully reduced, partially reduced, partially oxidized or fully oxidized state, such that the reduction/oxidation state of the crucible's finished surface is controlled for optimized performance in a Czochralski crystal puller.

In one embodiment, the surface with reduced chemical species by themselves or as a result of physical reactions and physical restructuring during the beginning of the Czochralski cycle nucleate. In operation upon contact with the silicon melt, there is a redox chemistry taking place at high temperatures followed by solvation chemistry. There is a natural tendency for uncontrolled nucleation of rosettes by some as yet unknown species. With the treated crucible surfaces of the invention, the likelihood of crystalline silicon dioxide crystal nucleation, crystal growth and/or rosette growth is significantly increased. This is to be contrasted with the treatment of quartz crucible surfaces with a barium compound, for example, where the crystalline structure produced is distinctly different from rosettes. In one embodiment, some of crystalline structures that are nucleated and grown are similar to the rosettes, and some structures are similar to the growth structures seen in a barium carbonate coated crucible.

In one embodiment of a treated quartz crucible, the surface of crucible is left with physical nuclei attached to the surface, e.g., a dispersal of crystalline silicon dioxide compounds to act as nuclei for crystal growth. In a second embodiment, the surface is left with metal cations which react to the surface of the quartz crucible in operation. In a third embodiment, the surface is covered with a gel or film in either a fully reduced, partially reduced, partially oxidized or fully oxidized state, such that the reduction/oxidation state of the crucible's finished surface is controlled via subsequent reactions during the silicon charge meltdown for optimized performance in a Czochralski crystal puller.

In yet another embodiment with the presence of germanium in the treated quartz glass article surface, it is believed that if incorporated into the silicon crystal, the germanium provides crystal stress relieved from vacancy incorporation. The germanium atom puts a small amount of compression on the lattice, thus compensating to some degree for the tension put on it by the presence of vacancy clusters.

Methods for Applying Surface Coating: In one embodiment, a solution for coating is first prepared by diluting the coating material in a suitable solvent. Examples of solvents which can be used for a Redox coating include halogenated alkane solvents, saturated aliphatic alcohols containing no more than 10 carbon atoms, aliphatic and aromatic hydrocarbons, ethers, aliphatic and aromatic nitrites and aromatic amines. Examples of solvents which can be for OH reactive embodiments include halogenated alkane solvents. In one embodiment wherein the Redox coating material is a silane, the molarity of the silane containing molecules in a solution is in the range of 0.1 to 1 millimolar.

In yet another embodiment, a solution for coating is first prepared by slurrying a finely ground crystalline powder in a tetramethoxysilane or tetramethoxygermane, diluting it in methanol or ethanol, and then applying it to the quartz glass surface and allowing the solvent to evaporate. In the next step, the treated surface can be air cured, hydrolyzed, or heated to low temperatures (30 to 300° C.) to accelerate the film drying and off-gassing of methanol.

The coatings may be applied on the quartz glass surface using methods known in the art, including manual methods such as brushing or a mechanically assisted method such as dip coating (self-assembly molecular coating), spin coating, spraying, and chemical vapor deposition. Dip coating can be performed for 1 minute or more. Spin coating can be performed at speeds of 10 to 300 rpm. In yet another embodiment, spin coating is performed at a speed of 20 to 150 rpm.

In one embodiment of a coating process, the coating is applied such that the quartz crucible remains in contact with the solution containing the coating for a time sufficient to leave a film of the coating containing molecules on the quartz crucible surface. In one embodiment, the quartz crucible surface remains in contact with the solution containing the Redox coating for about for a period of 30 seconds to 15 minutes.

In one embodiment, a sufficient amount of coating material is applied for the coated quartz article for the article with the reduced chemistry surface to have a service life of at least 10% longer upon exposure to silicon melt, than an uncoated surface. In another embodiment, a sufficient amount of coating material is applied for the article to have a service life of at least 30% longer than an uncoated crucible. In yet another embodiment of the invention a material is applied for the coated quartz article for the article with the reduced chemistry surface to have a service life of at least 50% longer upon exposure to silicon melt, than an uncoated surface. In still another embodiment, a sufficient amount of coating material is applied for the article to have a service life of at least 75% longer than an uncoated crucible.

In one embodiment of the invention, the coating is applied in a sufficient amount for the crucibles to remain in operation of at least 60 hours and at a temperature of in excess of 1420° C. In a second embodiment at a temperature of in excess of 1420° C., the crucibles remain in operation of at least 90 hours. In a third embodiment, the service life of the crucible is at least 120 hours.

The thickness of the coating varies depending on the type of coating to be applied as well as the application method. In one embodiment, the thickness of the coating on the quartz crucible is controlled to the thickness of a single layer. In one embodiment, the coating is applied approximately equal to a length of one molecule of a coating layer containing silane molecules. In another embodiment, the overall thickness is dependent on the number of desirable layers to be formed, 2-5 lengths of one molecule. In one embodiment, the thickness of the coating is between 10 angstroms to 1000 angstroms. In another embodiment, the thickness is between 1000 angstroms to 10,000 angstroms. In other embodiments, the thickness may be greater than 10,000 angstroms.

In one embodiment, at least a portion of the inner surface of a glass article, e.g., quartz glass crucible, is substantially coated with the inventive coating to provide a glass article having a service life of at least 10% longer than a quartz glass article not treated with the coating material. In another embodiment, at least a portion of the inner surface of a glass article, e.g., quartz glass crucible for use in growing single silicon crystal in a Czochralski operation, is substantially coated with the inventive coating to obtain a single silicon crystal containing at least 10 percent more single crystal silicon material yield than a single crystal silicon yield obtained absent said coating material. In still another embodiment, the entire inner surface of the quartz glass crucible is substantially coated with the coating for a substantially continuous layer, i.e., at least 75% of the surface to be coated, and in a contiguous manner to the extent possible. In another embodiment, only the part of the quartz glass crucible subsequently in contact with the silicon melt is treated with the Redox coating. For example, the coated region might be a ring at the melt line, or a ring that is at the corner curvature in the lower outside corner curve of the crucible. In yet another embodiment, the inner surface of the quartz glass crucible to be in contact with silicon melt is substantially coated to produce a substantially continuous layer of the coating, i.e., at least 80% of the crucible surface in contact with the melt is coated and in a contiguous manner to the extent possible.

In one embodiment after coating, the treated quartz glass article is annealed at a temperature within a range of 100° C. to 300° C. for a period of time ranging from 20 to 40 minutes prior to being placed in operation.

In one embodiment prior to the application of the coating, the quartz crucible surface is optionally "prepared" for coating by pre-treating by humidifying or exposing the surface to moist air. In one embodiment, the surface is treated by being immersed in water or treated with steam to ensure hydration of the surface, or cleaning prior to the application of the Lewis acid reactive coating material.

In one embodiment, the crucible surface is optionally prepared using a method as disclosed in U.S. Pat. No. 6,302,957, wherein the surface is cleaned by an acid such has aqueous hydrofluoric acid and/or aqueous nitric acid.

In another embodiment, the crucible surface is first optionally treated with an outer coating comprising at least a metal cation, e.g., cations of barium, calcium, and strontium, for controlled devitrification as disclosed in U.S. Patent Publication No. 2003/0211335.

In one embodiment, after the optional treating step and prior to the application of the Redox coating, the quartz crucible surface is prepared by creating a surface chemical state to optimize the binding of the Redox agent. In one embodiment, the crucible surface is first washed or cleaned with silicon tetrachloride ($SiCl_4$) in an anhydrous environment, essentially to create a surface of dangling Cl ligands. In the next step, the quartz glass surface is coated with a Redox coating material, e.g., an aminosilane such as $(CH_3)_3SiN(CH_3)_2$, $CH_3SiH_2N(CH_3)_2$, or $(CH_3)_2SiHN(CH_3)_2$.

In another example of the method of the invention, after the crucible surface is "prepared" by being washed or reacted with silicon tetrachloride ($SiCl_4$), the crucible surface is then allowed to hydrolyze with moisture in the air or steam, or rinsed with liquid H2O to produce a surface rich in exposed surface Si—OH bonds. In the next step, the crucible surface is coated or treated with an organosilane such as $(CH_3)_2SiCl_2$ to maximize the extent of the surface coverage of the methyl groups for the crucible.

In yet another example, the quartz glass surface is first treated with chlorine gas essentially to create a surface of dangling Cl ligands, then subsequent hydrolyzed with H2O in steam and then coated with a Redox coating in a solution.

Examples

Examples are provided herein to illustrate the invention but are not intended to limit the scope of the invention.

Example 1

A clean untreated crucible from Momentive Quartz of Willoughby, Ohio, USA is reacted with a Redox coating of $(CH_3)_2SiCl_2$ dissolved in 1,2 dichloropropane at a ratio of 1:2. The coating is done manually by brushing the entire crucible surface with the solution, with the excess being wiped off with clean wipes.

In operation and after the first Czochralski crystal pulling run, a number of densely formed brown rings are observed on parts of the coated crucible surface as shown in FIG. 5. The crucible surface develops a higher than normal density of rosettes (as represented by the brown rings) of at least 50%, compared to the number of brown rings appearing on an untreated crucible after such a crystal pulling run. Further, the rosettes are stable for the entire length of the run and show no degradation in the center.

Figure 6:
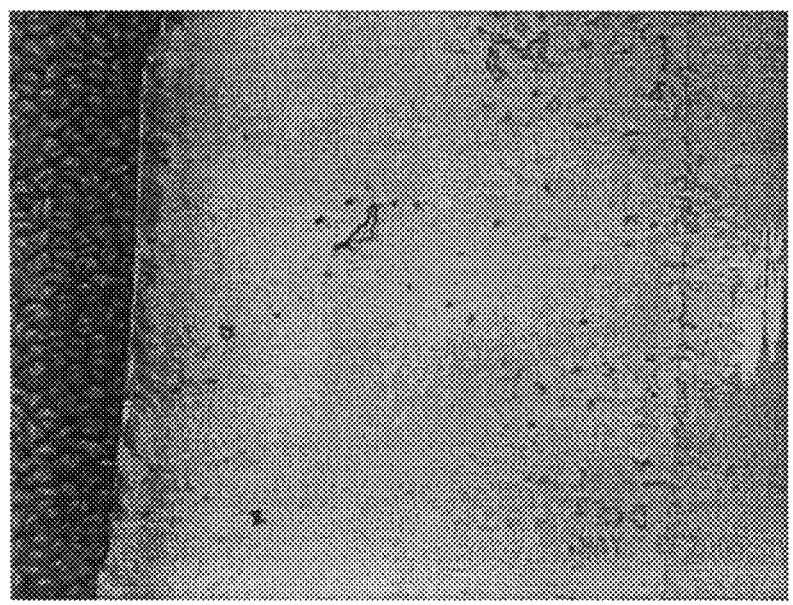
FIG. 6 is a photograph taken at approximately 1× or normal magnification, illustrating a coupon sample from a crucible made with a second embodiment of the coating of the invention, with densely formed "brown rings" having robust rosettes.

Besides the increased number of "brown rings" or density of rosettes, the rosettes are more well formed and appear to be thicker than the rosettes formed in the brown rings of a crucible untreated by the Redox coating of the invention. In close-up examination as illustrated in FIG. 6, it is observed that the rosettes formed within the brown rings have a very robust structure, i.e., with the brown rings being thick and distinct in appearance, and additionally, without showing little if any sign of having center flake out as in the rosettes in the untreated crucible of the prior art.

Example 2

A coupon cut from an untreated crucible from Momentive Quartz of Willoughby, Ohio, USA is first washed with silicon tetrachloride, then subsequently reacted with a source of moisture ($H_2O$) and then coated with a Redox coating of $(CH_3)_2SiCl_2$ dissolved in 1,1,1 trichloroethane at a ratio of 1:2. The coating is done manually by brushing the entire crucible surface with the silane solution. After coating, the excess solvent evaporates leaving the coating in place. The excess byproduct of the coating chemical is removed and the crucible is ready to use.

The coupon is exposed to melted silicon at a temperature in excess of 1420° C. and for 30 to 60 hours, simulating the condition of a Czochralski crystal pulling run. The coupon is removed from the melted silicon and observed under microphotography. Densely formed brown rings are observed covering at least 80% of the surface of the coupon (previously treated with the Redox coating). Additionally, the rosettes within the brown rings appear to be very thick and very robust, with no evidence of flaking shown.

Example 3

In this example, an untreated 22 inch crucible from GE Quartz of Newark, Ohio, USA was tested in a silicon crystal pulling operation vs. an embodiment of a crucible of the invention, a 22 inch crucible that was coated with a Redox coating of $(CH_3)_2SiCl_2$ dissolved in 1,2 dichloropropane at a ratio of 1:2 per procedure in Example 1. The yield after the first pass for the untreated crucible was less than ½ of the yield obtained for the coated crucible of the invention. Yield is measured as inches or centimeters of good silicon crystal obtained from a run.

Example 4

Untreated 22 inch crucible vs. the crucible prepared according to Example 1, a 22 inch crucible coated a Redox coating of $(CH_3)_2SiCl_2$ dissolved in 1,2 dichloropropane at a ratio of 1:2 were tested in a Czochralski run to measure the throughput. Throughput is defined as kilograms per hour of silicon obtained in a crystal pull. The average first pass throughput for the crucible of the invention was up to 3 times the average first pass throughput obtained from an uncoated crucible. These yield improvements are meant to serve as illustrations. The yield is also strongly dependent on the way the crystal pulling unit runs the Czochralski cycle and the type of crystals being grown. It is expected that the Czochralski crystal pulling unit is run in a manner consistent with those skilled in that technology.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A quartz glass article in the form of a crucible for growing single silicon crystal in a Czochralski operation, comprising:
a surface having coated thereon a coating material effecting a reduced chemistry on the coated surface, the coating material comprising at least one of a halogermane, a halostannate, an alkyl halo germane, an alkyl halo stannate, a substituted germane, an alkyl stannate, an alkoxy stannate, a Lewis acid, and mixtures thereof;
the glass article containing at least 99.0% $SiO_2$, wherein upon exposure to a meltdown and crystal pulling process cycle, the reduced chemical species react to form a plurality of rosettes and/or other crystalline morphology structures, covering at least 30% of the coated surface of the quartz glass crucible.

2. The quartz glass article of claim 1, wherein the coating material is dissolved in a solvent selected from the group of alkanes, halogenated alkanes, alcohols, and mixtures thereof prior to being applied onto the surface of the crucible.

3. The quartz glass article of claim 1, wherein the coating material comprises at least one of: a halogen hydrogen silane, a metallic halogen Lewis acid, an alkyl halosilane, and mixtures thereof.

4. The quartz glass article of claim 1, wherein the coating material comprises a Lewis acid selected from the group of: an alkyl magnesium halide; an aryl magnesium halide; an alkyl calcium halide; an alkyl strontium halide; and alkyl barium halide; a boron trifluoride; a ferric chloride; and an aluminum trichloride.

5. The quartz glass article of claim 1, wherein the coating material comprises at least a Lewis acid for providing at least one of a hydrogenated group and a metal for bonding to the coated surface of the crucible, modifying the coated surface chemistry.

6. The quartz glass article of claim 1, wherein the coating material comprises one of a halogen germane, an alkoxide of germane, an alkyl of germane, and an organogermane halogen.

7. The quartz glass article of claim 6, wherein the coating material comprises a least one of trialkylchlorogermane; dialkyldichlorogermane, alkyltrichlorogermane and dialkyldihalogengermane.

8. The quartz glass article of claim 6, wherein the coating material comprises a least one of an $(alkyl)_2GeCl_2$, an $(alkyl)_2GeBr_2$, an $(alkyl)_2GeF_2$, and an $(aryl)_2GeCl_2$, and mixtures thereof.

9. The quartz glass article of claim 6, wherein the coating material comprises at least one of an $Ge(alkoxy)4$, an $(alkyl)Ge(alkoxy)_3$, an $(alkyl)_2Ge(alkoxy)_2$ an $(alkyl)_3Ge(alkoxy)$, and mixtures thereof.

10. A process for preparing at least a surface of a quartz glass crucible of claim 1, for exposure to a silicon melt in growing single silicon crystal in a Czochralski operation, the process comprising: coating at least 75% of the surface to be exposed to the silicon melt with a material comprising at least one of a substituted germane, an alkyl stannate, an alkoxy stannate, a Lewis acid, and mixtures thereof, wherein the coating material provides at least one of a hydrogenated group and a metal for bonding to the coated surface of the crucible and the modified surface of the quartz crucible nucleates and forms crystalline structures covering at least 30% of the coated surface of the quartz glass crucible.

11. The process of claim 10, further comprising the steps of: dissolving the coating material in a solvent selected from the group of alkanes, halogenated alkanes, alcohols, and mixtures thereof; coating the surface of the crucible by applying the dissolved coating material on the crucible surface to be exposed to the silicon melt.

* * * * *